(12) United States Patent
Lamorey

(10) Patent No.: US 7,944,734 B2
(45) Date of Patent: May 17, 2011

(54) INTEGRATING NONVOLATILE MEMORY CAPABILITY WITHIN SRAM DEVICES

(75) Inventor: Mark C. H. Lamorey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/631,900

(22) Filed: Dec. 7, 2009

(65) Prior Publication Data

US 2010/0080042 A1  Apr. 1, 2010

Related U.S. Application Data

(62) Division of application No. 11/684,655, filed on Mar. 12, 2007, now Pat. No. 7,692,954.

(51) Int. Cl.
*G11C 11/00* (2006.01)
(52) U.S. Cl. .................... 365/154; 365/185.08; 365/158; 365/171; 365/173
(58) Field of Classification Search .................. 365/154, 365/156, 185.08, 158, 171, 173
See application file for complete search history.

(56) References Cited

U.S. PATENT DOCUMENTS

| | | | |
|---|---|---|---|
| 5,751,627 A | 5/1998 | Ooishi | |
| 6,269,027 B1 | 7/2001 | Hurst, Jr. et al. | |
| 6,295,627 B1 | 9/2001 | Gowni et al. | |
| 6,714,444 B2 * | 3/2004 | Huai et al. | 365/171 |
| 6,828,823 B1 | 12/2004 | Tsui et al. | |
| 6,862,226 B2 | 3/2005 | Toyoda et al. | |
| 6,876,228 B2 | 4/2005 | Sunaga et al. | |
| 6,894,549 B2 | 5/2005 | Eliason | |
| 6,980,459 B2 | 12/2005 | Seshadri et al. | |
| 6,992,359 B2 | 1/2006 | Nguyen et al. | |
| 7,038,938 B2 | 5/2006 | Kang | |
| 7,082,053 B1 * | 7/2006 | Jenne et al. | 365/173 |
| 7,206,217 B2 | 4/2007 | Ohtsuka et al. | |
| 7,599,210 B2 * | 10/2009 | Okazaki et al. | 365/148 |
| 7,791,941 B2 * | 9/2010 | Hanafi | 365/185.08 |
| 2002/0024064 A1 | 2/2002 | Shibata | |
| 2004/0141363 A1 | 7/2004 | Ohtsuka et al. | |
| 2004/0141393 A1 | 7/2004 | Ku et al. | |

(Continued)

FOREIGN PATENT DOCUMENTS

DE  10211337 A1  10/2003

(Continued)

OTHER PUBLICATIONS

Supplemental European Search Report; European Application No. 08731980.2-2210 / 2135250; Date of mailing: Dec. 3, 2010; 6 pages.

(Continued)

*Primary Examiner* — Tuan T Nguyen
*Assistant Examiner* — R Lance Reidlinger
(74) *Attorney, Agent, or Firm* — Cantor Colburn LLP; Michael LeStrange

(57) ABSTRACT

A nonvolatile static random access memory (SRAM) device includes a pair of cross-coupled, complementary metal oxide semiconductor (CMOS) inverters configured as a storage cell for a bit of data and a pair of magnetic spin transfer devices coupled to opposing sides of the storage cell. The magnetic spin transfer devices are configured to retain the storage cell data therein following removal of power to the SRAM device, and are further configured to initialize the storage cell with the retained data upon application of power to the SRAM device.

8 Claims, 3 Drawing Sheets

U.S. PATENT DOCUMENTS

| | | | |
|---|---|---|---|
| 2006/0023503 A1 | | 2/2006 | Lee |
| 2006/0083088 A1 | | 4/2006 | Katti |
| 2006/0102934 A1 | * | 5/2006 | Kanno |
| 2006/0157788 A1 | * | 7/2006 | Joshi |
| 2007/0165446 A1 | * | 7/2007 | Oliva et al. .................. 365/154 |
| 2010/0202191 A1 | * | 8/2010 | Ahn et al. .................... 365/154 |

FOREIGN PATENT DOCUMENTS

| | | | |
|---|---|---|---|
| EP | 1326255 A2 | | 7/2003 |
| FR | 2849526 A1 | * | 7/2004 |

OTHER PUBLICATIONS

W. Zhao et al.; "Integration of Spin-RAM technology in FPGA circuits;" IEEE 2006.

U.S. Appl. No. 11/849,550 Non-Final Office Action dated Aug. 18, 2010.

Pereira et al., "A Novel GDSII Compression Technique," 25th Annual BACUS Symposium on Photomask Technology, Proc. of SPIE, vol. 59923N-1 to 59923N-8, 2005.

N. Bruchon et al.; "Magnetic Remanent Memory Structures for Dynamically Reconfigurable FPGA;" IEEE, 2005; pp. 687-690.*

Wang et al.; Spin Dependent Tunneling Device Fabricated for Magnetic Random Access Memory Applications Using Latching Mode, Journal of Applied Physics, vol. 87, No. 9, May 1, 2009, pp. 6385-6387.*

Hass et al.; "Magnetic Flip Flops for Space Applications,:" IEEE Transactions on Magnetics, vol. 42, No. 10, Oct. 2006; pp. 2751-2753.*

PCT/US 08/56632 PCT Search Report.*

* cited by examiner

INTEGRATING NONVOLATILE MEMORY CAPABILITY WITHIN SRAM DEVICES

CROSS-REFERENCE TO RELATED APPLICATION

This application is a divisional of U.S. patent application Ser. No. 11/684,655, filed Mar. 12, 2007, now U.S. Pat. No. 7,692,954, the disclosure of which is incorporated by reference herein in its entirety.

BACKGROUND

The present invention relates generally to integrated circuit memory devices and, more particularly, to an apparatus and method for integrating nonvolatile memory capability within static random access memory (SRAM) devices.

A typical SRAM device includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor (6T) cell, a pair of access transistors or pass gates (when activated by a word line) selectively couples the inverters to a pair of complementary bit lines. Other SRAM cell designs may include a different number of transistors, e.g., 4T, 8T, etc.

As is the case with other types of volatile memories, data within a conventional SRAM is lost once power is removed or deactivated. In contrast, nonvolatile RAM devices retain the cell data when its power supply is turned off by utilizing a floating gate transistor having a charge placed thereon to modify the threshold voltage ($V_t$) of the device in a manner that reflects the state of the data retained in the cell. This type of device is well known in the art and may generally be classified according to three types of nonvolatile RAM: Erasable Programmable Read Only Memory (EPROM); Electrically Erasable Programmable Read Only Memory (EEPROM); and Flash memory that may be erased and programmed in blocks consisting of multiple locations.

Although the read performance of nonvolatile RAM (e.g., Flash) devices is somewhat adequate in terms of speed, the write operation of these devices is much slower (e.g., on the order of a few milliseconds) as compared to the nanosecond range of an SRAM device. Similarly, the power involved in a non-volatile read is comparable to that of an SRAM, however the power involved in a write operation is much greater for the non-volatile cell. Accordingly, it would be desirable to be able to combine the speed performance characteristics of an SRAM device with the non-volatility of floating gate devices, and in a manner that minimizes increases in device real estate so as to result in a so called "universal memory."

SUMMARY

The foregoing discussed drawbacks and deficiencies of the prior art are overcome or alleviated by a nonvolatile static random access memory (SRAM) device. In an exemplary embodiment, the SRAM device includes a pair of cross-coupled, complementary metal oxide semiconductor (CMOS) inverters configured as a storage cell for a bit of data and a pair of magnetic spin transfer devices coupled to opposing sides of the storage cell. The magnetic spin transfer devices are configured to retain the storage cell data therein following removal of power to the SRAM device, and are further configured to initialize the storage cell with the retained data upon application of power to the SRAM device.

In another embodiment, a method of integrating nonvolatile capability within a static random access memory (SRAM) device includes coupling a pair of magnetic spin transfer devices to opposing sides of an SRAM storage cell; the SRAM storage cell further comprising a pair of cross-coupled, complementary metal oxide semiconductor (CMOS) inverters configured to store a bit of data therein; and wherein the magnetic spin transfer devices are configured to retain the storage cell data therein following removal of power to the SRAM device, and are further configured to initialize the storage cell with the retained data upon application of power to the SRAM device.

In still another embodiment, a method for implementing nonvolatile retention of a data bit stored in an SRAM cell includes charging a programming node to a first bias voltage about halfway between a logic high voltage and a logic low voltage of the SRAM cell; respectively coupling one side of a pair of magnetic spin transfer devices to opposing sides of an SRAM storage cell through activation of a pair of pass gate devices, with an opposite side of the pair of magnetic spin transfer devices coupled to the programming node, so as to pass current through a first of the magnetic spin transfer devices in a first direction, and to pass through a second of the magnetic spin transfer device in a second, opposite direction; wherein passing current in the first direction causes programming of the first magnetic spin transfer device to a low resistance state, and passing current in the second direction causes programming of the second spin transfer device to a high resistance state; and removing a source of power to the SRAM cell upon achieving the low resistance state in the first magnetic spin transfer device, and achieving the high resistance state in the second magnetic spin transfer device; wherein the data stored in the SRAM cell prior to power source removal is maintained within the pair of magnetic spin transfer devices following power source removal.

BRIEF DESCRIPTION OF THE DRAWINGS

Referring to the exemplary drawings wherein like elements are numbered alike in the several Figures.

DETAILED DESCRIPTION

Disclosed herein is an apparatus and method for integrating nonvolatile memory capability within SRAM devices so as to result in a "universal memory" through modification of an existing SRAM structure. Briefly stated, the present disclosure introduces an apparatus and method for combining spin valve MRAM (Magnetic Random Access Memory) elements with an SRAM cell to result in an SRAM technology that provides the added advantages of a nonvolatile write and read command.

MRAM is an emerging non-volatile memory technology. Historically, MRAM technology is based on a structure referred to as a Magnetic Tunnel Junction (MTJ), which may be thought of as a programmable resistor. The state of an MTJ is traditionally switched by magnetic fields created by currents flowing in the selected bitline (BL) and wordline (WL). One particular type of low power, magnetic field-based approach to writing MRAM devices is known as "toggle mode" switching, which uses a multi-step write with a modified multi-layer cell. The cell is modified to contain an "artificial antiferromagnet" where the magnetic orientation alternates back and forth across the surface, with both the pinned and free layers consisting of multi-layer stacks isolated by a thin "coupling layer." The resulting layers have only two stable states, which may be toggled from one to the other by timing the write current in the two lines so one is slightly delayed, thereby rotating the field. Any voltage less than the full write level actually increases its resistance to flipping. Thus, other cells located along one of the write lines will not suffer from the half-select problem, allowing for smaller cell sizes.

However, an even newer usage of the materials and physics used in MRAM technology is for a "spin transfer device" or a "spin valve." This structure is almost physically identical to the MTJ, but the magnetic and tunneling qualities of the structure are different such that the switching (write) mechanism is different with respect to field-switched MRAM devices. More specifically, a spin transfer device of spin valve uses spin-aligned ("polarized") electrons to directly torque the domains. If the electrons flowing into a layer are caused to change their spin, a torque is developed that is transferred to the nearby layer. This in turn lowers the amount of current needed to write the cells, making it about the same as the read process. Electrically speaking, such a device is a programmable resistor that is switched by passing current through the device. A high resistance state is set by passing current in one direction while a low resistance state is set by passing current in another direction. As described in further detail hereinafter, such spin transfer devices may be advantageously combined with SRAM cells to provide nonvolatile capability during power on/off operations of the memory device.

Figure 1A:
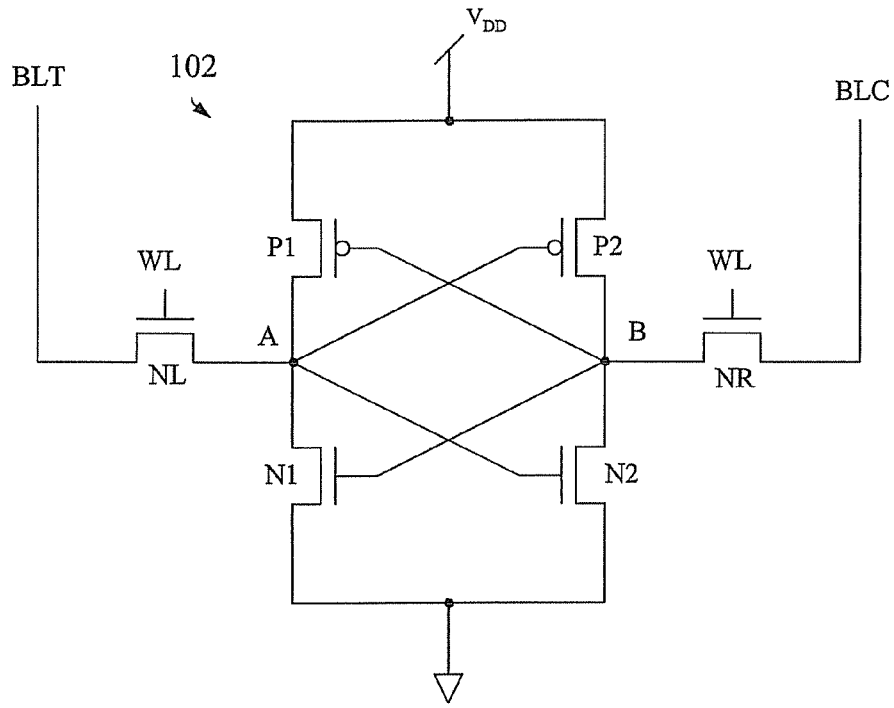
FIG. 1(a) is a schematic diagram of a conventional SRAM cell structure.
Figure 1B:
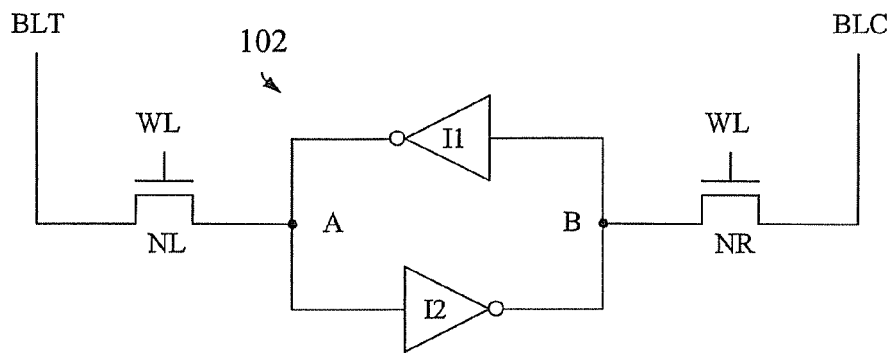
FIG. 1(b) is a simplified version of the SRAM cell of FIG. 1(a)

Referring initially to FIGS. 1(a) and 1(b), there is shown a schematic diagram of a conventional SRAM cell structure 100, which represents a single memory cell included within a memory array arranged in rows and columns. The SRAM cell structure 100 includes a six-transistor memory cell 102 that is capable of storing a binary bit of information. Specifically, the memory cell 102 includes a pair of cross-coupled, complementary metal oxide semiconductor (CMOS) inverters (depicted as I1 and I2 in FIG. 1(b)). One inverter (I1) includes an NFET storage transistor N1 and a PFET load transistor P1. Similarly, a second inverter (I2) includes an NFET storage transistor N2 and a PFET load transistor P2.

Transistors P1 and P2 are often referred to as "pull-up" transistors because of their coupling to the voltage source $V_{DD}$. Transistors N1 and N2 are similarly referred to as "pull-down" transistors because of their coupling to ground. The memory cell 102 further contains NFET access transistors (also referred to as "pass gates") NL and NR serving as switches, each of which are coupled between the bistable circuit (P1, N1, P2 and N2) and a pair of true and complementary bit lines BLT and BLC, respectively. Pass gates NL and NR are activated by an appropriate signal generated on a wordline WL. As indicated previously, however, the conventional memory cell 102 loses the data stored therein once device power is removed. Upon restoring power to the cell 102, it will arbitrarily assume one of the two stable logic states after a brief metastable period.

Figure 2:
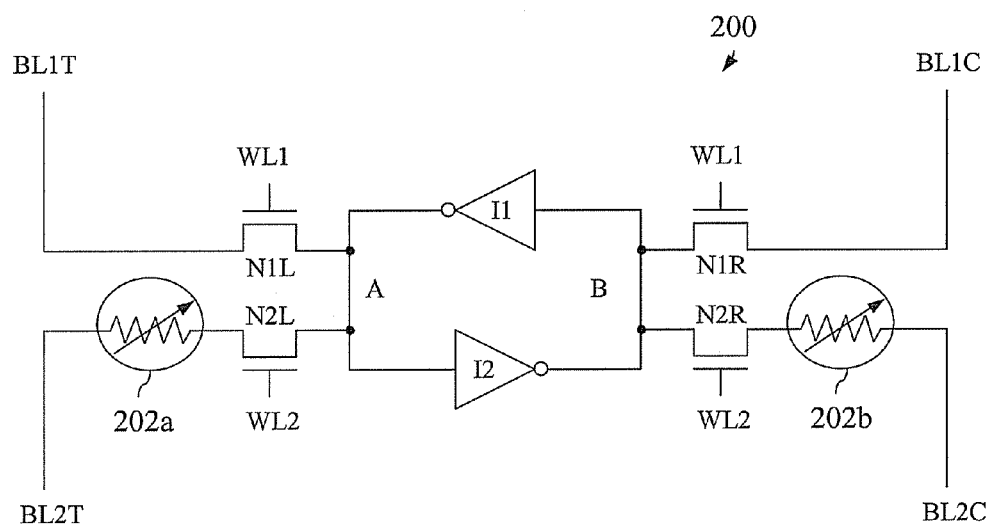
FIG. 2 is a schematic diagram of an SRAM cell configured with a pair of magnetic spin transfer devices for nonvolatile capability, in accordance with an embodiment of the invention.

Therefore, in accordance with an embodiment of the invention, FIG. 2 is a schematic diagram of an SRAM cell 200 configured with a pair of magnetic spin transfer devices 202a, 202b for nonvolatile capability. In the embodiment depicted, it will be noted that, in addition to a first port for conventional SRAM read/write operations (i.e., complementary bitlines BL1T and BL2T coupled to the cell nodes A and B through pass gates N1L and N1R controlled by a first wordline signal WL1), a second port is also provided for nonvolatile storage. More specifically, the second port includes an additional pair of bitlines BL2T and BL2C respectively coupled to the magnetic spin transfer devices 202a, 202b. The magnetic spin transfer devices 202a, 202b are in turn respectively coupled to cell nodes A and B through another set of pass gate devices N2L and N2R, controlled through a second wordline signal WL2. Although certain existing SRAM designs may employ two separate ports, this is conventionally done so as to enable concurrent read/write operations to increase bandwidth, as opposed to using a second port for non-volatile storage during power off/power on operations as described below.

The second port is used for nonvolatile storage in both a write (STORE) mode of operation and a read (RESTORE) mode of operation as described below. As indicated above, the magnetic spin transfer devices are used as programmable resistances, the values of which depend on the direction and magnitude of the current passed therethrough.

Figure 3:
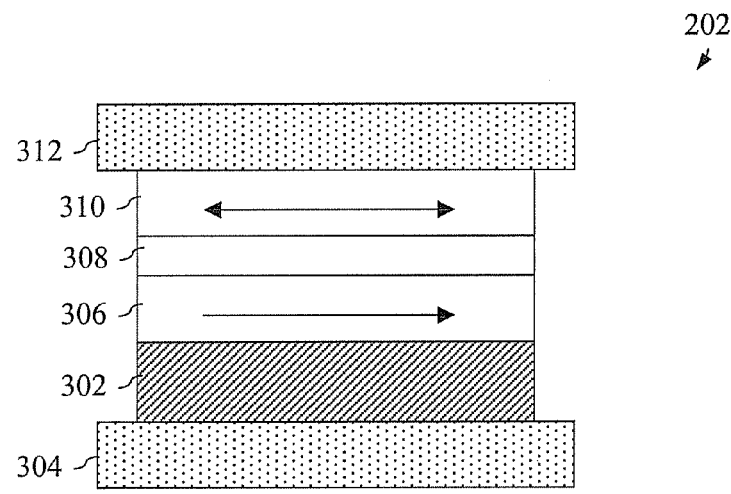
FIG. 3 is a cross sectional view of a spin transfer device type magnetic element, suitable for use in accordance with an embodiment of the invention.

FIG. 3 is a cross sectional view of an exemplary spin transfer device type magnetic element 202, such as used in FIG. 2. As is shown, the spin transfer device 202 includes an antiferromagnetic (AFM) layer 302 formed over a bottom contact 304 (e.g., copper wiring), a pinned (reference) layer 306 formed over the AFM layer 302, and a conductive spacer layer 308 between the pinned layer 306 a free layer 310. A top contact 312 is also shown formed above the free layer 310. It should be noted, however, that additional layers (not shown), such as seed or capping layers could also be used. Both the pinned layer 306 and the free layer 310 include ferromagnetic material, whereas the conductive spacer layer 308 is nonmagnetic. Whereas the free layer 310 has a changeable magnetization (indicated by the double headed arrow), the magnetization of the reference layer 306 (depicted by the single headed arrow) is fixed or pinned in a particular direction by the AFM layer 302. The top and bottom contacts 312, 314, are used to drive current through the conventional magnetic element 202.

The orientations of the magnetic moment of the free layer 310 are also known as "parallel" and "antiparallel" states, wherein a parallel state refers to the same magnetic alignment of the free and reference layers, while an antiparallel state refers to opposing magnetic alignments therebetween. In terms of resistance, when the magnetization of the free layer 310 is parallel to the magnetization of the pinned reference layer 306, the resistance of the magnetic element 202 is low. Conversely, when the magnetization of the free layer 310 is antiparallel to the magnetization of the reference layer 306, the resistance of the magnetic element 202 is high.

Referring once again to FIG. 2, during "normal" power-on operations, the magnetic elements 202a, 202b are isolated from the SRAM cell nodes A and B, but are utilized during non volatile power-down (STORE) and power-up (RESTORE) operations as follows:

To store the data from the SRAM cell 200 in preparation for removing power to the device (i.e., a STORE operation), both bitlines BL2T, BL2C in the second port are charged to an intermediate logic voltage value, $V_{DD}/2$. Collectively, BL2T and BL2C may be referred to as a programming node. Then, the WL2 signal is brought high so as to facilitate current flow through the spin transfer devices 202a, 202b. Depending on the logical state of the SRAM cell, current will flow from one of the bitlines (BL2T, BLTC) into to the SRAM cell node on one side and out from the SRAM cell node to the other of the bitlines from the other side. In turn, the difference in current flow direction will program one of the spin transfer MRAM devices into a high resistance state and the other into a low resistance state.

By way of specific example, it will be assumed that node A has a logical "1" stored thereon and node B has a logical "0" stored thereon at the time of the nonvolatile STORE operation. When BL2T and BL2C (charged to $V_{DD}/2$) are coupled to the cell nodes, current will flow out of node A (since node A is charged to $V_{DD}$), through spin transfer device 202a, to BL2T. At the same time, current will flow from BL2C, through spin transfer device 202b, to node B (being at ground). Assuming the spin transfer devices are similarly oriented with respect to the cell nodes, the opposing current flow directions program one of the spin transfer devices into a high resistance state and the other into a low resistance state, as stated above.

For a RESTORE or "power-up" operation, it is assumed that the chip has been shut off without power for some period of time, but with the memory data successfully maintained therein in a nonvolatile manner, such as by the STORE operation described above. Upon activating power to the chip, each of the SRAM latches of the device will arbitrarily assume a logic state based upon factors such as processing defects (e.g., in voltage threshold characteristics) or random power anomalies in the chip. Through implementation of a RESTORE command, both bit lines BL2T and BL2C in FIG. 2 are brought, in one embodiment, to ground. The WL2 signal is activated to then couple the cell nodes A, B to the spin transfer devices 202a, 202b, which were previously programmed high/low resistance states. Whichever of the two nodes spin transfer devices 202a, 202b has the low resistance state programmed therein will provide a more conductive path to the bitline (grounded in this case).

If the low resistance spin transfer device happens to correspond to the node that initially powered up to logic low, then the SRAM node coincidentally powered up to the correct state, and will not be flipped by the RESTORE operation. On the other hand, if the SRAM node powered up to the opposite state (i.e., the node powering up to $V_{DD}$ corresponds to the low resistance spin transfer device), then the low resistance path to ground will cause the storage node to flip its state. In other words, the low resistance spin transfer device offers a lower resistance to ground compared to the high resistance spin transfer device, and this relative difference in paths to ground causes the SRAM cell to flip its state. Thereafter, WL2 may be deactivated so that the SRAM can then operate as normal during "power on" conditions through the first port (i.e., through bitline pair BL1T/BL1C).

It should also be appreciated that the SRAM cell 200 could also be logically configured such that, in the RESTORE mode of operation, BL2T and BL2C are brought to $V_{DD}$ instead of ground. In this case, the cell node corresponding to the low resistance spin transfer device would be brought to (or maintained at) $V_{DD}$ instead of ground. That is, the low resistance spin transfer device would offers a lower resistance path to $V_{DD}$ compared to the high resistance spin transfer device, and the relative difference in resistance paths to $V_{DD}$ would causes the SRAM cell to flip its state.

From a wiring standpoint, it will further be appreciated that although the embodiment of FIG. 2 depicts the spin transfer devices as being connected between the bitlines and the pass gates, the spin transfer devices could alternatively be connected between the pass gates and the cell nodes. That is, spin transfer device 202a could be connected between pass gate N2L and cell node A, spin transfer device 202b could be connected between pass gate N2R and cell node B. In such a configuration, the spin transfer devices would completely isolated with respect to both voltage and current on the bit line by the pass gates during normal, power-on operations. On the other hand, a design tradeoff would be the additional wiring used to connect from the cell node located on the wafer level, up to the spin transfer device (located in the mid to upper wiring levels due the sensitivity of magnetic materials to thermal processes), and back down to the pass gate connection on the wafer level.

As presently depicted, the spin transfer devices are isolated with respect to current by the pass gates but are not isolated as to voltage on the bitlines. However, since spin transfer devices are written with currents and not voltages, the normal power-on operations of the SRAM device do not affect the programmed state of the spin transfer devices. This is because the level and duration of any current experienced by the spin transfer devices in SRAM cell read/write operations are orders of magnitude too small with respect to the amounts involved in programming a spin transfer device. It is also possible to design a SRAM chip that has a power on sequence that first powers the drivers of the pass gates, thereby reducing the opportunity for stray current to flow through the MTJ. Moreover, the wiring becomes more simplified in that the spin transfer device is coupled to substrate transistor devices only on one side; the other side is connected to bitline wiring.

Figure 4:
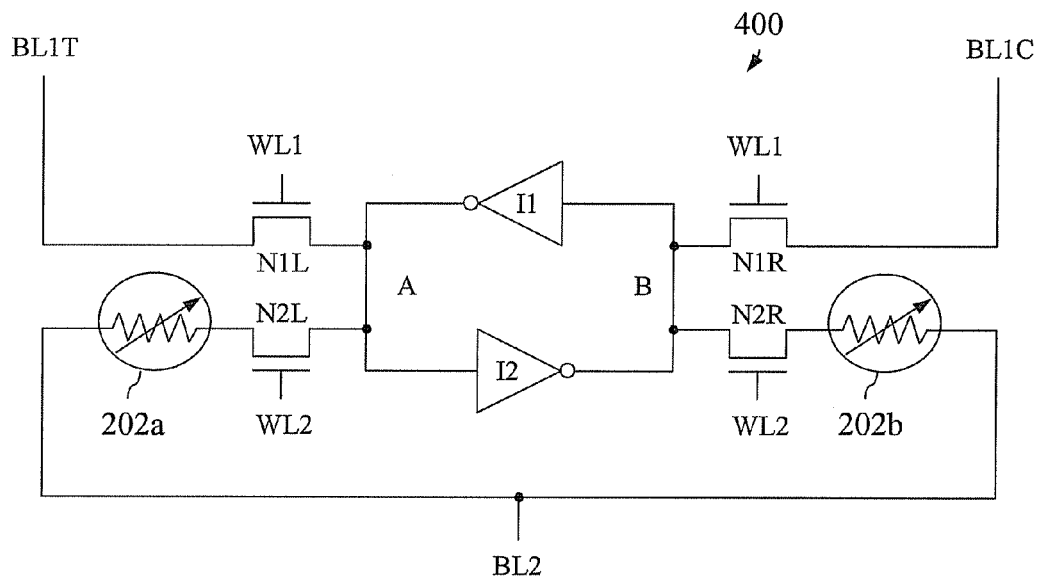
FIG. 4 is a schematic diagram of an alternative embodiment of the nonvolatile SRAM device of FIG. 2.

Referring now to FIG. 4, there is shown a schematic diagram of a nonvolatile SRAM device 400, in accordance with an alternative embodiment of the invention. In one respect, device 400 is a more simplified version of FIG. 2, in that the bitlines used in the second (programming) port need not comprise a complementary pair of bitlines (true, complement) as would be the case for a conventional SRAM port. Since the bitlines are charged to the same voltage in either the STORE and RESTORE modes of operation (e.g., $V_{DD}/2$, ground, $V_{DD}$), a single common node can be used as a global programming node for both spin transfer devices 202a, 202b, as well as for corresponding spin transfer devices in other SRAM cells. In FIG. 4, the common global programming node is designated as BL2. Thus, in addition to being a common node for the illustrated cell in FIG. 4, BL2 can also be global for all SRAM cells on a chip/block.

Figure 5:
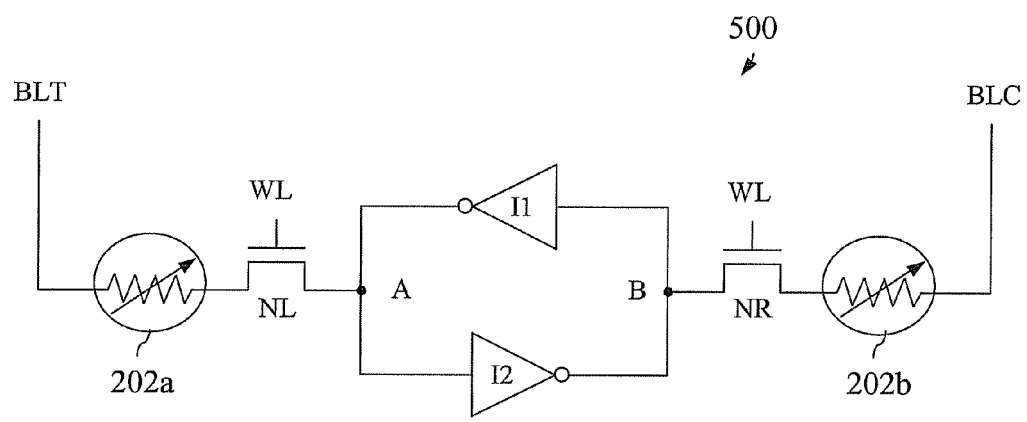
FIG. 5 is a schematic diagram of still an alternative embodiment of the nonvolatile SRAM device of FIGS. 2 and 4.

Finally, FIG. 5 is a schematic diagram of a nonvolatile SRAM device 500, in accordance with an alternative embodiment of the invention. In contrast to the embodiments of FIGS. 2 and 4, the SRAM device 500 of FIG. 5 utilizes a single port for normal, powered SRAM operations as well as for the nonvolatile STORE/RESTORE operations when power is disconnected/connected to the device. Because the resistances of the spin transfer devices 202a, 202b are in line with the cell during regular READ and WRITE operations, a performance tradeoff is the presence of an additional resistance in series with the latch (versus a multi port design having additional capacitance on the SRAM nodes).

Design Considerations

In terms of specific programmed resistances, ranges and differences between the high resistance state and low resistance state, such design values are tunable in that multiple MTJ spin transfer devices may be arranged in series to increase the absolute signal (resistance value). The relative signal with respect to the high and low programmed states is limited as a practical matter by the MTJ technology and has been demonstrated to range from 20% to 200% MR (magnetoresistance), wherein $R_{high}=R_{low}*(1+MR)$. The absolute signal from a single MTJ spin transfer device, $R_{low}$, has been demonstrated to range from about 100 Ω to about 2 KΩ, and is also tunable.

With respect to performance, the most time consuming operation of the nonvolatile SRAM embodiments would be the program the programming of the spin transfer devices during the STORE operation prior to system power down. The MTJ spin transfer devices are programmed as a direct function of current density and time. The more current provided, the quicker the free layers of the device are programmed/flipped, and vice versa. As such, the programming time of a spin transfer device is primarily determined by the size of the pass gate access transistors and the transistors inside the latch itself.

Although the spin transfer devices are programmed by passing current passing therethrough, the time taken to do so is much greater than the time needed to restore or flip the SRAM cell. Thus, the prospect of unintentional programming of the spin transfer devices while writing the SRAM cell is not of any significant concern. Furthermore, the current coming out of the SRAM cell in a STORE operation should not allow the SRAM cell to lose its programmed state. In this event, the cell data could be lost before such time as the current has successfully programmed the spin transfer devices to the correct nonvolatile storage resistance values. The simplest solution to this issue is to size the pass gate access transistors small enough such that the SRAM cell will not be flipped during restore. Another option is to apply a voltage on the pass gate wordline to a value below $V_{DD}$ to limit the current.

As mentioned above, magnetic stack technology has a low thermal budget, although it has been demonstrated to be viable anywhere in the back end of line (BEOL) process. However, in order to minimize thermal exposure, it is desirable to form the magnetic devices closer to the end of the process to minimize the thermal exposure. This also provides the additional flexibility of being able to differentiate between a conventional SRAM device and a nonvolatile SRAM device at a later point in time in the manufacturing process.

Thus configured, the above described embodiments allow for a SRAM module to be expanded into a nonvolatile memory module, while still having, approximately, the SRAM performance. The chip differs from a standard SRAM in that it can power down through a sequence that will retain the data for a power up sequence that can restore its last known state. The chip also differs from a standard MRAIVI or FLASH chip in that standard operation of the chip is identical to that of an SRAM with a marginal reduction in performance.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A nonvolatile static random access memory (SRAM) device, comprising:
   a pair of cross-coupled, complementary metal oxide semiconductor (CMOS) inverters configured as a storage cell for a bit of data;
   a pair of magnetic spin transfer devices coupled to opposing sides of the storage cell;
   wherein the magnetic spin transfer devices are configured to retain the storage cell data therein following removal of power to the SRAM device, and are further configured to initialize the storage cell with the retained data upon application of power to the SRAM device; and
   a single port coupled to the SRAM cell, the single port comprising a pair of pass gates, the pair of magnetic spin transfer devices and a pair of bitlines;
   wherein the pair of bitlines is configured for read and write operations of the SRAM cell during power on conditions, and wherein the pair of bitlines also serves as a programming node.

2. The device of claim 1, wherein the magnetic spin transfer devices are configured to retain storage cell data by programming of a low resistance state in one of the magnetic spin transfer devices and a high resistance state the other of the magnetic spin transfer devices.

3. The device of claim 2, wherein the magnetic spin transfer devices are programmed to the low and high resistance states by application of current therethrough.

4. The device of claim 3, wherein the low resistance state corresponds to current passed through either of the magnetic spin transfer devices in a first direction, and the high resistance state corresponds to current passed through either of the magnetic spin transfer devices in a second, opposite direction.

5. A method of integrating nonvolatile capability within a static random access memory (SRAM) device, the method comprising:
   coupling a pair of magnetic spin transfer devices to opposing sides of an SRAM storage cell;
   the SRAM storage cell further comprising a pair of cross-coupled, complementary metal oxide semiconductor (CMOS) inverters configured to store a bit of data therein;
   wherein the magnetic spin transfer devices are configured to retain the storage cell data therein following removal of power to the SRAM device, and are further configured to initialize the storage cell with the retained data upon application of power to the SRAM device; and
   coupling a single port to the SRAM cell, the single port comprising a pair of pass gates, the pair of magnetic spin transfer devices and a pair of bitlines;
   wherein the pair of bitlines is configured for read and write operations of the SRAM cell during power on conditions, and wherein the pair of bitlines also serves as a programming node.

6. The method of claim 5, wherein the magnetic spin transfer devices are configured to retain storage cell data by programming of a low resistance state in one of the magnetic spin transfer devices and a high resistance state the other of the magnetic spin transfer devices.

7. The method of claim 6, wherein the magnetic spin transfer devices are programmed to the low and high resistance states by application of current therethrough.

8. The method of claim 7, wherein the low resistance state corresponds to current passed through either of the magnetic spin transfer devices in a first direction, and the high resistance state corresponds to current passed through either of the magnetic spin transfer devices in a second, opposite direction.

* * * * *